United States Patent
Lu et al.

(10) Patent No.: US 7,208,409 B2
(45) Date of Patent: Apr. 24, 2007

(54) INTEGRATED CIRCUIT METAL SILICIDE METHOD

(75) Inventors: Jiong-Ping Lu, Richardson, TX (US);
Duofeng Yue, Plano, TX (US);
Xiaozhan Liu, Garland, TX (US);
Donald S. Miles, Plano, TX (US);
Lance S. Robertson, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 99 days.

(21) Appl. No.: 11/073,982

(22) Filed: Mar. 7, 2005

(65) Prior Publication Data

US 2005/0208764 A1    Sep. 22, 2005

Related U.S. Application Data

(60) Provisional application No. 60/554,332, filed on Mar. 17, 2004.

(51) Int. Cl.
*H01L 21/44* (2006.01)
*H01L 21/336* (2006.01)
*H01L 21/8234* (2006.01)

(52) U.S. Cl. .............. 438/664; 438/721; 438/684; 438/306; 438/655; 438/151; 438/197; 257/E21.203; 257/E21.204; 257/E21.296; 257/E21.593; 257/E21.622; 257/E21.636

(58) Field of Classification Search ............... 438/721, 438/664, 684, 306, 655, 151, 197; 257/E21.203, 257/E21.204, E21.296, E21.593, E21.622, 257/E21.636
See application file for complete search history.

(56) References Cited

U.S. PATENT DOCUMENTS

| | | | |
|---|---|---|---|
| 7,060,610 B2 | 6/2006 | Lee | |
| 2001/0045605 A1 | 11/2001 | Miyashita et al. | |
| 2004/0101999 A1* | 5/2004 | Oda et al. | ............. 438/197 |

* cited by examiner

*Primary Examiner*—Walter L. Lindsay, Jr.
(74) *Attorney, Agent, or Firm*—Peter K. McLarty; W. James Brady, III; Frederick J. Telecky, Jr.

(57) ABSTRACT

Fluorine containing regions (70) are formed in the source and drain regions (60) of the MOS transistor. A metal layer (90) is formed over the fluorine containing regions (70) and the source and drain regions (60). The metal layer is reacted with the underlying fluorine containing regions to form a metal silicide.

20 Claims, 1 Drawing Sheet

INTEGRATED CIRCUIT METAL SILICIDE METHOD

This application claims priority under 35 USC § 119(e)(1) of provisional application Ser. No. 60/554,332, filed Mar. 17, 2004.

FIELD OF THE INVENTION

The invention is generally related to the field of MOSFET transistors and more specifically to a method of forming metal silicide regions in MOS integrated circuits for reducing salicide filaments and improving yield.

BACKGROUND OF THE INVENTION

Conventional metal-oxide-semiconductor (MOS) transistors often use metal silicide layers to reduce resistance. A self aligned silicidation process (salicide) is often used to form the region of titanium, cobalt or tungsten silicide on the gate electrode and source-drain regions of the MOS transistor. In this process, a blanket metal film is deposited on the silicon substrate containing the MOS transistor structure. The metal is then reacted with the underlying silicon regions to form a low resistance metal silicide. Any unreacted metal remaining on the substrate is then removed using a metal etch process that is selective to the metal silicide present. During this process it is critical that the metal silicide be confined to the source-drain and gate regions. In the case of the source-drain regions, if the metal silicide forms under the transistor sidewall structures, the transistors could become inoperable. Furthermore the metal silicide layer should form a relatively smooth interface with the underlying source-drain region. Any unevenness in the metal silicide/source-drain interface will lead to increased leakage currents and reduced breakdown voltages.

In order to reduce the resistances associated with the metal silicide regions, nickel is finding increasing use in forming the metal silicide regions in MOS transistors, particularly for transistors with physical gate length of less than 40 nm and/or MOS transistors with ultra-shallow junctions. Nickel has a very high diffusivity in silicon leading to the formation of nickel silicide regions that extend beneath the transistor sidewall structures. In addition, nickel silicide regions formed using existing methods have a very rough interface with underlying p-type source-drain regions. As described above, this results in transistors with higher leakage currents and reduced breakdown voltages. There is therefore a need for a method to form metal silicide regions on the gate electrode and source-drain regions of a MOS transistor that have a smooth interface with the underlying source-drain region as well as not extend under the transistor sidewall structures.

SUMMARY OF THE INVENTION

The instant invention comprises a method for forming metal silicide regions on MOS transistors. The method comprises forming fluorine containing regions in the source and drain regions of the MOS transistor. In an embodiment, the fluorine containing regions comprise a fluorine concentration of around $1\times10^{17}$ to $5\times10^{21}$ cm$^{-3}$ formed to depths of 5 to 300 Angstroms. The fluorine containing regions can be formed by exposing the source and drain regions to a fluorine containing plasma or by implanting fluorine or a fluorine containing species into the source and drain regions. A metal layer is formed over the fluorine containing regions and the source and drain regions. The metal layer is reacted with the underlying fluorine containing regions to form a metal silicide.

Figure 1A:
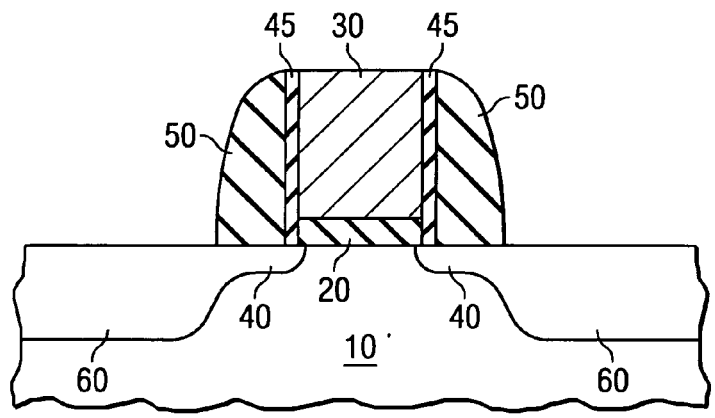
FIGS. 1(a)–1(d) are cross-sectional diagrams showing an embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIG. 1(a) through FIG. 1(d), the instant invention can be utilized in many semiconductor device structures. The methodology of the instant invention provides a solution to forming metal silicide regions with a smooth interface that do not extend under the transistor sidewall structures.

An embodiment of the instant invention will now be described by referring to FIG. 1(a) through FIG. 1(d). Referring to FIG. 1(a), a silicon substrate 10 is provided. A gate dielectric 20 is formed on the silicon substrate 10. The gate dielectric 20 may, for example comprise an oxide, thermally grown SiO$_2$, a nitride, an oxynitride, or any combination thereof, and is preferably on the order of 1 to 20 nm thick. The gate dielectric layer can also be formed using a high K dielectric material with a dielectric constant greater than 3.9. Examples of high K dielectric material include hafnium containing dielectrics such as hafnium oxide, hafnium oxynitride, etc. A layer of silicon containing material (not shown, but which will be patterned and etched to form the gate electrode structure 30) is formed on gate dielectric 20. Preferably, this silicon-containing material is comprised of polycrystalline silicon ("poly" or "polysilicon"), but it may be comprised of amorphous silicon, epitaxial silicon or any other semiconducting material.

The region of the silicon substrate 10 shown in FIG. 1(a) through FIG. 1(d) can be either n-type or p-type. In forming CMOS integrated circuits, n-type and p-type well regions are formed in the silicon substrate. The region of the substrate 10 shown in FIG. 1(a) through FIG. 1(d) can represent a portion of an n-well or a p-well region in a silicon substrate. In the case of a p-well region a NMOS transistor will be formed. In a similar manner for an n-well region 10 a PMOS transistor will be formed.

With the gate electrode structure 30 defined using standard photolithography processes and polysilicon etching, a spacer 45 is formed, for example, by first thermally growing about 10–50 A of oxide followed by a depositing about 150 A of TEOS oxide. In other embodiments the spacer 45 can comprise a combination of silicon nitride and/or silicon oxide (either grown or deposited) layers. For a NMOS transistor where region 10 comprises a portion of a p-type well, a blanket n-type drain-source extension implant is performed resulting in the n-type doped region 40. The n-type doped region 40 is often referred to as a lightly doped drain (LDD) or a moderately doped drain (MDD) extension region. In addition to the drain-source implant, pocket implants are sometimes performed. For the case where the transistor shown in FIG. 1(a) is a NMOS transistor, the pocket implant would comprise a p-type dopant species. In current integrated circuit technology, pocket implants refer to an implant that is used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor. The species of the p-type pocket implant can consist of B, $BF_2$, Ga, In, or any other suitable p-type dopant. The species of the n-type LDD implant can consist of As, P, Sb, or any other suitable n-type dopant. The order of the implants is somewhat arbitrary and the LDD implant could be performed before the pocket implant.

For a PMOS transistor where region 10 comprises a portion of a n-type well, a blanket p-type drain-source extension implant is performed resulting in p-type doped regions 40. The p-type doped region 40 is often referred to as a lightly doped drain (LDD) or a moderately doped drain (MDD) extension region. In addition to the drain-source implant, pocket implants are sometimes performed. For the case where the transistor shown in FIG. 1(a) is a PMOS transistor, the pocket implant would comprise an n-type dopant species. In current integrated circuit technology, pocket implants refer to an implant that is used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor. The species of the n-type pocket implant can consist of As, P or any other suitable n-type dopant. The species of the p-type source-drain extension implant can consist of boron or any other suitable p-type dopant. The order of the implants is somewhat arbitrary and the pocket implant can be performed before the source-drain extension implant.

After the completion of the source-drain extension implant process (and pocket implant if performed), and any subsequent processing, the transistor sidewall structures 50 are formed as shown in FIG. 1(a). In an embodiment of the instant invention, the sidewall structures 50 comprise a plurality of silicon oxide and silicon nitride dielectric layers. The sidewall structures 50 are formed by first depositing blanket layers of suitable dielectric material. An anisotropic etch is then used to form the sidewall structures 50. The sidewall structures 50 can also be formed using a single suitable dielectric material such as silicon nitride or silicon oxide.

Following the formation of the sidewall structures 50, the source and drain regions 60 are formed. For a NMOS transistor, n-type dopants such as arsenic and/or phosphorous are implanted into the silicon region 10 adjacent to the sidewall structures 50. For a PMOS transistor, p-types dopants such as boron are implanted into the silicon region 10 adjacent to the sidewall structures 50. Therefore, for a NMOS transistor region 60 will be doped n-type and, for a PMOS transistor, region 60 will be doped p-type. Following the formation of the source and drain regions 60, a high temperature source-drain anneal is performed to activate the implanted dopants and remove the damage to the silicon region 10 created during the ion implantation process. The source-drain anneal can comprise a rapid thermal annealing (RTA) process where the source and drain regions are annealed at temperatures above 800° C. for times ranging from a second to minutes.

Figure 1B:
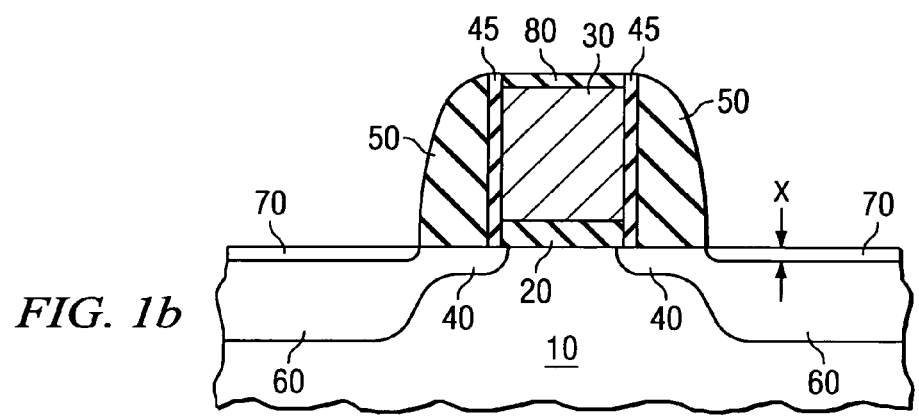

Shown in FIG. 1(b) is the structure of FIG. 1(a) following the formation of fluorine containing regions 70 in the source and drain regions 60. It should be noted that the fluorine containing regions 70 are formed after all the source-drain annealing processes have been completed. The fluorine containing regions are near surface regions with a depth x of around 5 to 300 Angstroms and fluorine concentrations of $1\times10^{17}$ to $5\times10^{21}$ $cm^{-3}$. In an embodiment, the fluorine containing regions 70 are formed by exposing the source and drain regions 60 to a fluorine containing plasma. Such a process can comprising flowing $NF_3$ at 1–20 sccm, $N_2$ at 0–100 sccm, $H_2$ at 0–100 sccm and/or Ar at 0–100 sccm in a plasma chamber at pressures of 50–100 mtorr and power levels of 75–200 watts. Other gases that can be used in a plasma to form the fluorine containing region include $NF_3/H_2$, $NF_3/NH_3$, $NF_3/N_2$, $NF_3/Ar$, $NF_3/N_2/H_2$, $CF_4/H_2/Ar$, $C_2F_6/Ar$, and $C_2F_6/H_2$. The fluorine containing plasma processes of the instant invention should be differentiated from other fluorine containing plasmas used to etch oxides and/or perform other types of surface treatments. These processes are optimized to not incorporate fluorine into the underlying silicon regions and in fact are optimized to leave no fluorine containing residue. The ability of fluorine to confine the formation of metal silicide regions was unknown prior to the instant invention and the formation of a near surface region of fluorine using plasmas is counter intuitive to the current uses of fluorine containing plasmas in the semiconductor arts.

In another embodiment of the instant invention, the fluorine containing region 70 can be formed by ion implanting fluorine and/or fluorine containing species into the source and drain regions 70 at energies of 0.2 to 5 KeV and doses of $1\times10^{11}$ to $1\times10^{16}$ $cm^{-2}$. During the process of forming the fluorine containing regions 70 in the source and drain regions 60, a fluorine containing region 80 may also be formed in the gate electrode structure 80. The fluorine containing region 80 in the gate electrode structure 30 will assist in the subsequent formation of the nickel silicide layer that will be formed in the gate electrode structure 30. In those instances where no fluorine containing region is desired in the gate electrode structure 30, a blocking layer or mask can be used to mask the gate electrode structure 30 during the fluorine incorporation process.

Figure 1C:
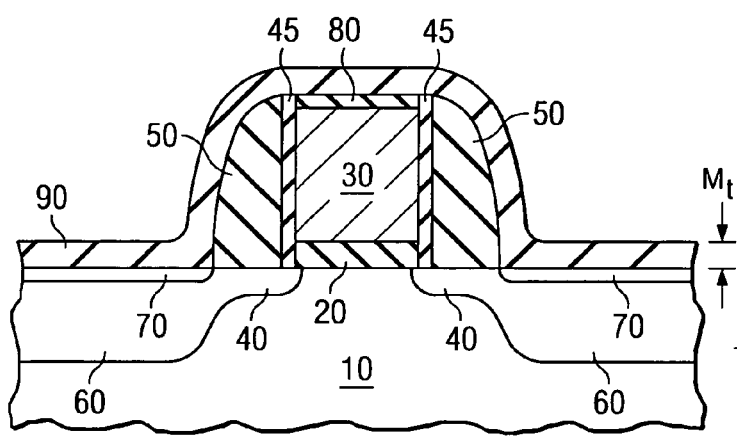
Figure 1D:
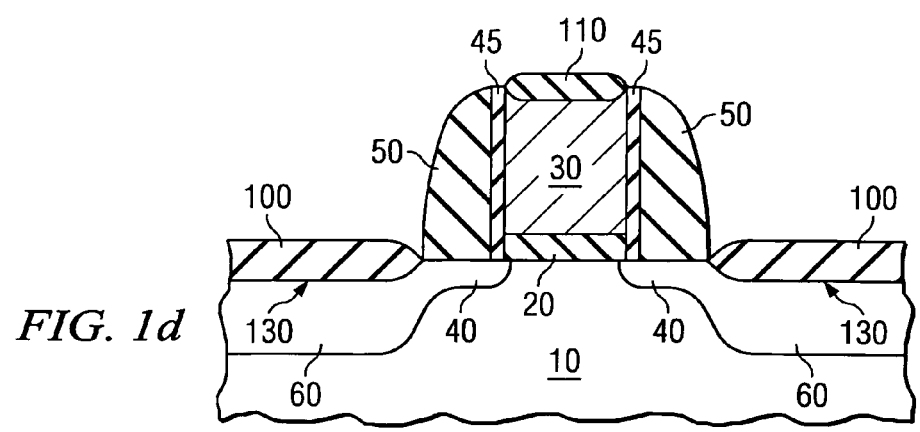

Following the formation of the fluorine containing regions 70 shown in FIG. 1(b), a metal layer 90 is formed over the structure of FIG. 1(b) as shown in FIG. 1(c). In an embodiment of the instant invention the metal layer comprises nickel. In addition to nickel, other metals include cobalt, molybdenum, platinum, etc. For the case where nickel is used to form the metal layer 90, the thickness $m_t$ of the metal layer 90 is between 30 to 400 Angstroms. In some instances, the formation of the fluorine containing layer 70 and the subsequent metal layer 90 can be performed in-situ in multiple chambers of a single cluster tool or in a single chamber.

Following the formation of the metal layer 90, the structure shown in FIG. 1(c) is thermally annealed causing the overlying metal layer 90 to react with the underlying silicon regions to form metal silicide regions. It should be noted that no reaction takes place between the metal layer 90 and the sidewall structures 50. Following the formation of the metal silicide regions, the unreacted metal is chemically removed resulting in the metal silicide regions 100 and 110 shown in FIG. 1(d). In the case where nickel is used to form the metal layer 90, nickel monosilicide (NiSi) is formed 100, 110 by annealing the nickel metal layer 90 at temperatures from 250° C. to 550° C. In this embodiment, the fluorine containing regions 70 will be consumed during the silicide formation process and there will be a pile-up of fluorine at the interface 130 of the NiSi regions 100 and the source and drain regions 60. Following the process of the instant invention, the measured fluorine concentration at the interface between the NiSi regions 100 and the underlying source and drain regions 60 will be on the order of $1\times10^{17}$ to $5\times10^{21}$ cm$^{-3}$. During the formation of the NiSi regions 100 in the source and drain regions 60, a NiSi region 110 will also be simultaneously formed in the gate electrode structure 30.

The above described metal silicide formation process can be used for both NMOS and PMOS transistors. In the case of NMOS transistors, the above described process minimizes the formation of metal silicide regions under the sidewall structures and results in a smooth metal silicide/source drain interface 130. In the case of PMOS transistors, the above described process minimizes the unevenness in the metal silicide/source-drain interface 130 and results in reduced leakage currents and increased breakdown voltages.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method to form MOS transistors, comprising:
   forming a dielectric layer over a semiconductor;
   forming a gate electrode structure over said dielectric layer;
   forming sidewall structures comprising silicon oxide layers and silicon nitride layers adjacent said gate electrode structure;
   implanting dopant species into said semiconductor adjacent to said gate electrode structure and said sidewall structures to form source and drain regions;
   annealing said source and drain regions after said implanting of said dopant species;
   forming fluorine containing regions in said source and drain regions after said annealing by exposing said source and drain regions to species formed in a fluorine containing plasma;
   forming a metal layer over said source and drain regions and said fluorine containing regions; and
   reacting said metal layer with said underlying fluorine containing regions to form metal silicide regions in said source and drain regions.

2. The method of claim 1 wherein said dielectric layer is on the order of 1 to 20 nm thick.

3. The method of claim 1 wherein said fluorine containing regions comprise fluorine in concentrations of $1\times10^{17}$ to $5\times10^{21}$ cm$^{-3}$.

4. The method of claim 3 wherein said fluorine containing regions are formed to a depth of around 5 to 300 Angstroms.

5. The method of claim 1 wherein said fluorine containing plasma is formed using a gas comprising NF3.

6. The method of claim 5 wherein said fluorine containing plasma and said metal layer are formed in multiple chambers of a single cluster tool.

7. The method of claim 5 wherein said metal layer comprises nickel.

8. The method of claim 6 wherein said metal layer comprises nickel.

9. A method to form metal silicide regions in a MOS transistor, comprising:
   forming a dielectric layer over a semiconductor;
   forming a gate electrode structure over said dielectric layer;
   implanting dopant species into said semiconductor adjacent to said gate electrode structure to form source and drain regions;
   annealing said source and drain regions after said implanting of said dopant species;
   forming fluorine containing regions in said source and drain regions after said annealing;
   forming a metal layer over said source and drain regions and said fluorine containing regions; and
   reacting said metal layer with said underlying fluorine containing regions to form metal silicide regions in said source and drain regions.

10. The method of claim 9 wherein said fluorine containing regions comprise fluorine in concentrations of $1\times10^{17}$ to $5\times10^{21}$ cm$^{-3}$.

11. The method of claim 10 wherein said fluorine containing regions are formed to a depth of around 5 to 300 Angstroms.

12. The method of claim 11 wherein said fluorine containing regions are formed by exposing said source and drain regions to a fluorine containing plasma comprising flowing NF$_3$ at 1–20 sccm, N$_2$ at 0–100 sccm, and H$_2$ at 0–100 sccm in a plasma chamber at pressures of 50–100 mtorr and power levels of 75–200 watts.

13. The method of claim 11 wherein said fluorine containing regions are formed by ion implanting fluorine or a fluorine containing species into the source and drain regions 70 at energies of 0.2 to 5 KeV and doses of $1\times10^{11}$ to $1\times10^{16}$ cm$^{-2}$.

14. The method of claim 12 wherein said metal layer comprises nickel.

15. The method of claim 13 wherein said metal layer comprises nickel.

16. A method to form source and drain metal silicide regions in a MOS transistor, comprising:
   forming a dielectric layer over a semiconductor;
   forming a gate electrode structure over said dielectric layer;
   implanting dopant species into said semiconductor adjacent to said gate electrode structure to form source and drain regions;
   annealing said source and drain regions subsequent to said implanting of said dopant species;
   forming fluorine containing regions in said source and drain regions after said annealing wherein said fluorine containing regions comprise fluorine in concentrations of $1\times10^{17}$ to $5\times10^{21}$ cm$^{-3}$ and said fluorine containing regions are formed to a depth of around 5 to 300 Angstroms;
   forming a nickel layer over said source and drain regions and said fluorine containing regions; and
   reacting said metal layer with said underlying fluorine containing regions to form metal silicide regions in said source and drain regions.

17. The method of claim 16 wherein said fluorine containing regions are formed by exposing said source and drain regions to a fluorine containing plasma comprising flowing NF$_3$ at 1–20 sccm, N$_2$ at 0–100 sccm, and H$_2$ at 0–100 sccm in a plasma chamber at pressures of 50–100 mtorr and power levels of 75–200 watts.

18. The method of claim 16 wherein said fluorine containing regions are formed by ion implanting fluorine or a fluorine containing species into the source and drain regions 70 at energies of 0.2 to 5 KeV and doses of $1\times10^{11}$ to $1\times10^{16}$ cm$^2$.

19. A method to form integrated circuits, comprising:

forming a dielectric layer over a semiconductor;

forming a gate electrode structure over said dielectric layer;

forming sidewall structures comprising silicon oxide layers and silicon nitride layers adjacent said gate electrode structure;

implanting dopant species into said semiconductor adjacent to said gate electrode structure and said sidewall structures to form source and drain regions;

annealing said source and drain regions after said implanting of said dopant species;

forming fluorine containing regions in said source and drain regions after said annealing by exposing said source and drain regions to species formed in a fluorine containing plasma, said fluorine containing plasma formed using a gas comprising $NF_3$;

forming a metal layer comprising nickel over said source and drain regions and said fluorine containing regions wherein said fluorine containing regions and said metal layer are formed in multiple chambers of a single cluster tool;

reacting said metal layer with said underlying fluorine containing regions to form metal silicide regions in said source and drain regions.

20. The method of claim 19 wherein said fluorine containing regions are formed to a depth of around 5 to 300 Angstroms.

* * * * *